United States Patent [19]

Tyan

[11] 4,207,119
[45] Jun. 10, 1980

[54] POLYCRYSTALLINE THIN FILM CDS/CDTE PHOTOVOLTAIC CELL

[75] Inventor: Yuan-Sheng Tyan, Webster, N.Y.

[73] Assignee: Eastman Kodak Company, Rochester, N.Y.

[21] Appl. No.: 911,843

[22] Filed: Jun. 2, 1978

[51] Int. Cl.² .................................. H01L 31/06
[52] U.S. Cl. .................. 136/89 TF; 136/89 CD; 357/16; 357/30; 357/59; 427/76; 427/85; 427/255.3
[58] Field of Search ......... 136/89 TF, 89 CD, 89 ST; 357/16, 30, 59; 204/192 P; 427/74, 76, 85, 248 C

[56] References Cited

U.S. PATENT DOCUMENTS

| 3,142,586 | 7/1964 | Colman | 117/215 |
| 3,811,953 | 5/1974 | Nozik | 136/89 |
| 4,035,197 | 7/1977 | Raychaudhuri | 136/89 CD |

FOREIGN PATENT DOCUMENTS 848290 11/1976 Belgium .
1564356 10/1970 Fed. Rep. of Germany .
45-36055 11/1970 Japan .

OTHER PUBLICATIONS

L. M. Fraas et al., "CdS Thin Films for Terrestrial Solar Cells", *J. Crystal Growth*, vol. 39, pp. 92-107 (1977).
J. Lebrun, "A New CdTe Thin Film Solar Cell", *Conf. Record, IEEE Photovoltaic Specialists Conf.*, (1970), pp. 33-39.
Aerospace Research Laboratories Report ARL 69-0155 (Oct. 1969). (AD 702095).
NSF/RANN Report SE/AER-75-1679/75-1, (Jan. 1976), NTIS Publication PB-252893.
NSF/RANN Report SE/AER-75-1679, FR/76 (1976).
A. L. Fahrenbuch et al, "Recent Results on II-VI Heterojunctions for Photovoltaic Solar Energy Conversion, " *Conf. Record, 12th IEEE Photospecialists Conf.*, Nov. 1976, pp. 529-533.
A. L. Fahrenbuch et al., "II-VI Photovoltaic Heterojunctions for Solar Energy Conversion", *Appl. Phys. Lett.*, vol. 25, pp. 605-608 (1974).
K. Yamaguchi et al., "Photovoltaic Effect in CdTe-CdS Junctions Prepared by Vapor Phase Epitaxy", *Japan J. Appl. Phys.*, vol. 15, pp. 1575-1576 (1976).
D. Bonnet et al. "New Results on the Development of a Thin Film CdTe-n-CdS Heterojunction Solar Cell", *Conf. Record, 9th Photospecialists Conf.*, (1972), pp. 129-132.
N-Nakayama et al., "Ceramic Thin Film CdTe Solar Cell", *Japan J. Appl. Phys.*, vol. 15, pp. 2281-2282, (1976).
H. Uda et al., "Polycrystalline Thin Film CdS/CdTe Solar Cells", *Japan J. Appl. Phys.*, vol. 17, pp. 585-586 (1978).
E. Adirovich et al., "Thin Film Structures with nCds-pCdTe Heterojunction", *Proc. Int. Conf. Phys. Chem. Semicond. Heterolayer Structure*, vol. 2, pp. 151-158 (1970).
E. I. Adirovich et al., "Photoelectric Effects in Film Diodes with CdS-CdTe Heterojunctions", *Soviet Physics-Semicond.*, vol. 3, pp. 61-64 (1969).
S. Wagner et al., "Air Anneals of Unencapsulated in P/CdS Solar Cells", *J. Electrochem. Soc.*, vol. 123, pp. 1254-1256 (1976).
J. Lebrun, "Thin Film Cadmium Telluride Solar Cell", *Proc. Int'l Conf. Phys. & Chem. of Semicond. Heterojunctions*, Hungary (1970), pp. IV-163-170.

*Primary Examiner*—Aaron Weisstuch
*Attorney, Agent, or Firm*—Dana M. Schmidt

[57] ABSTRACT

A photovoltaic cell and a process of making and using it are disclosed wherein extremely thin semiconductor layers are provided through the use of polycrystalline CdS and CdTe. The cell has conversion efficiencies as high as 6% or more when exposed to AM2 light.

31 Claims, 2 Drawing Figures

POLYCRYSTALLINE THIN FILM CDS/CDTE PHOTOVOLTAIC CELL

BACKGROUND OF THE INVENTION (1) Field of the Invention

This invention relates to p-n cadmium telluride-cadmium sulfide photovoltaic cells, particularly of the thin-film type.

(2) State of the Prior Art

Effective conversion from expensive petroleum-based energy sources to solar energy sources, such as photovoltaic cells, has been delayed prior to this invention by two factors—the cost of mass-producing such cells and the low conversion efficiency achieved by such cells. Any improvement in either factor can move industry towards the use of more solar cells, and an improvement in both has been a long-sought goal.

A study by R. Moore reported in *Solar Energy*, 18, p. 225 (1976) indicates that thin-film inorganic semiconductor photovoltaic cells should be able to meet the two-fold goal noted above if the individual semiconductive layers do not exceed 5 microns in thickness, assuming conversion efficiencies of at least 5%. Implied is the conclusion that such cells would be even more useful if the conversion efficiencies were higher. The study concludes with the statement that such thin-film cells as described are predicated on "a currently non-existent technological base."

Conversion efficiencies of 5% or more have been difficult to achieve in thin-film solar cells, particularly in solar cells fabricated from CdS and CdTe, hereinafter identified as CdS/CdTe solar cells. Such CdS/CdTe cells have a distinct cost advantage, compared for example to single-crystal silicon cells. Conversion efficiencies, however, must be increased to render them useful. Therefore, considerable effort has been expended to establish techniques for manufacturing such cells with improved conversion efficiencies, as well as reduced thicknesses. Vapor deposition or similar vapor-phase formation of either CdTe upon a crystal of CdS, or of CdS upon a crystal of CdTe, has been used as a means of partially reducing the film thickness, enhancing conversion efficiency, or both, as is reported in articles by A. Fahrenbruch et al, *Appl. Phys. Letters*, 25, p. 605 (1974); R. Bube et al, Report NSF/RANN-/Se/AER-75-1679/76/1; and K. Yamaguchi et al, *Japan J. Appl. Phys.*, 15, p. 1575 (1976). Such prior techniques have relied largely upon the use of single crystal substrates for the vapor deposition. Utilization of single crystal substrates, however, precludes the achievement of the economic advantages associated with thin-film cells, since a single crystal must be grown and sliced. The slicing operation necessarily involves waste of material and produces cells which at best are 50 to 100 microns thick. Thus, it is not possible to manufacture a bilayer solar cell, one layer of which is a single crystal, that is as thin as 10 microns as suggested in the Moore study. In each of the foregoing, the vapor deposition or similar process was done in the absence of oxygen.

In Bonnet, "New Results on the Development of a Thin-Film p-CdTe-n-CdS Heterojunction Solar Cell", 9th IEEE Photovoltaic Specialist Conference, p. 129 (1972), there is reported a thin-film cell of polycrystalline material alleged to have produced a conversion efficiency of 5%. However, the reported $I_{sc}$ value, measured with 50 mW/cm² illumination, was 1.5 mA per 10 mm², or 15 mA/cm². This corresponds to an $I_{sc}$ value of 30 mA/cm² for a 100 mW/cm² illumination, the standard "AM1" sunlight condition. Since the theoretical limit of $I_{sc}$ under AM1 conditions is only about 24 mA/cm², clearly there was a positive error in the observations and the conversion efficiency was less than the reported value of 5%.

SUMMARY OF THE INVENTION

In accord with the present invention, there is advantageously featured a photovoltaic cell having the dual properties of greatly reduced cost and a markedly improved conversion efficiency compared to similar cells previously produced.

In accord with a related aspect of the invention, there is advantageously featured such a cell wherein the overall thickness is greatly reduced.

These features of the invention are based upon the discovery that CdS/CdTe solar cells can be manufactured to have both thin-film characteristics, and conversion efficiencies in excess of 5 and even 6% in AM2 light, characteristics not available in the prior art. More specifically, in accordance with one aspect of the invention, there is provided a cell for converting incident radiation into electricity, comprising first and second contiguous polycrystalline layers containing, respectively, p-type cadmium telluride and n-type cadmium sulfide, and electrodes in operative, low-impedance contact with at least part of the layers, at least one of the electrodes being transparent or semi-transparent to the incident radiation, said cell being further characterized by a conversion efficiency of at least about 6.0% when exposed to AM2 light.

In accordance with another aspect of the invention, there is provided an n-type CdS and p-type CdTe photovoltaic cell containing operative electrodes, wherein both the cadmium telluride and the cadmium sulfide are polycrystalline, and together the layers contain oxygen atoms in an amount that is effective to produce a cell having a conversion efficiency that is enhanced over the conversion efficiency of a cell that is produced without the oxygen atoms present.

In accordance with yet another aspect of the invention, there is provided an n-type CdS and p-type CdTe photovoltaic cell containing operative electrodes, the improvement being that the total thickness of the cell does not exceed about 10 microns and at least one of the layers contains oxygen atoms in an amount that is effective to produce a cell having a conversion efficiency that is enhanced over the conversion efficiency of a cell that is produced without the oxygen atoms in the layer.

Such cells can be manufactured by a process of depositing, in the vapor phase, contiguous layers of the semiconductor material, in a manner such that at least one of the layers is deposited in an oxygen-containing atmosphere for a time and at a temperature, and in an amount of oxygen, which are sufficient to provide a conversion efficiency that is enhanced over the efficiency of a cell produced without the oxgen atmosphere.

DESCRIPTION OF THE PREFERRED EMBODIMENTS

Figure 1:
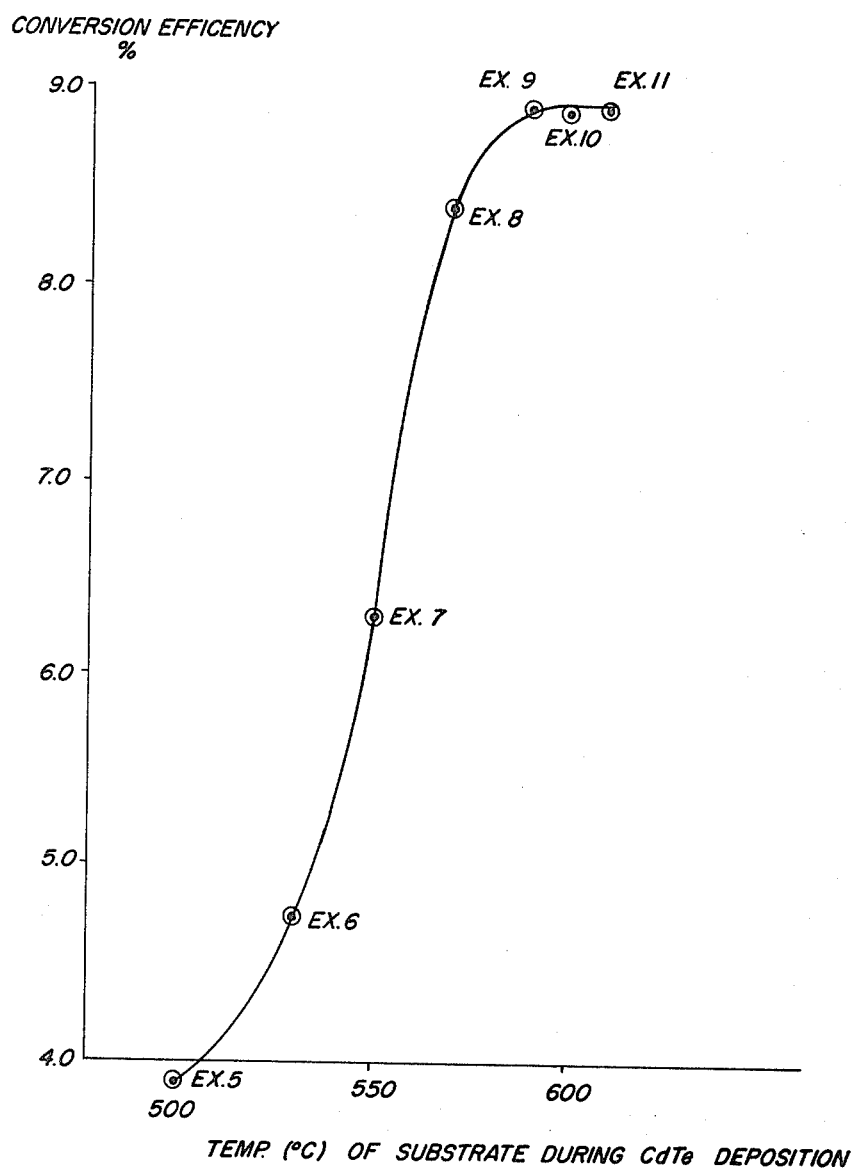
FIG. 1 is a plot of conversion efficiencies achievable by cells of the invention, versus the substrate temperature useful for the formation of the CdTe layer.

"Photovoltaic cell" as used herein means a solid state device which produces an electric current in response to light of appropriate wavelengths, from any source.

It has been found that the dual results of reduced cost and enhanced conversion efficiency can be produced by a photovoltaic cell having polycrystalline cadmium sulfide and polycrystalline cadmium telluride in contiguous layers. Such polycrystalline semiconductive materials allow the inexpensive layered formation of a truly thin cell, inasmuch as the combined thickness of two layers of polycrystalline semiconductor materials need not exceed about 100 microns, and preferably does not exceed about 10 microns.

The enhancement of the conversion efficiency of such cells is achieved by forming one or both of the semiconductive layers in an oxygen-containing atmosphere. Maximum enhancement occurs when the layers are formed at a particular range of temperatures.

As used herein, "enhanced conversion efficiency" means a conversion efficiency that is about 10% greater than the conversion efficiency of a control cell produced without the enhancing step. In practice, much larger enhancements than 10% are common when using the invention.

Because of their simplicity, preferred methods of forming the layers using an oxygen-containing atmosphere are those in which the semiconductive layers are deposited in the vapor phase. As used herein, "depositing in the vapor phase" is used to mean any process wherein material is transferred in the vapor phase from a source, usually heated, to a substrate where the material forms a new layer. Therefore, as used here "depositing in the vapor phase" includes, but is not limited to, close-space sublimation, vapor transporting, vacuum evaporation, vapor growth, and sputtering or ion plating wherein ionized or plasma gas, respectively, is the activating medium. "Close-space sublimation" means sublimation from a source to a substrate positioned from the source a distance no greater than the square root of the smaller of the surface areas of the source and of the substrate. All of these are known processes, and except as noted hereinafter, follow conventional procedures.

The atmosphere for the vapor-phase depositing can be either pure oxygen, oxygen artificially admixed with other gases, or air. As will be readily apparent, the actual amount of the oxygen present during deposition will depend upon the specific form of vapor-phase depositing that is selected. For example, close-space sublimation, a highly preferred form of the process of the invention, can tolerate much higher levels of gas than can vacuum evaporation, which preferably utilizes about $10^{-4}$ torr of gas. The other forms of vapor-phase depositing mentioned above have known or standard tolerance levels of gas, and the amount of oxygen pressure or partial pressure is selected to comply with such tolerance levels.

The process preferably proceeds by depositing, in the vapor phase, cadmium sulfide onto a suitable electrode, described below, with or without oxygen present in the atmosphere. Thereafter, the cadmium telluride and, optionally, a p-type dopant such as gold are similarly deposited in the vapor phase onto the previously formed cadmium sulfide, with or without oxygen present in the atmosphere, except that at least one of the two layers is deposited with oxygen gas present.

Thereafter, an electrode capable of making a low impedance contact is formed on at least a portion of the cadmium telluride. A preferred process of such electrode formation is vacuum deposition.

The vapor-phase depositing of the semiconductor material can be done either as a batch process, e.g., in a vacuum chamber containing a single source and a single substrate, or as a continuous process in which a substrate is moved through appropriate zones of treatment.

As indicated, a highly useful form of the vapor-phase depositing is close-space sublimation. The oxygen atmosphere of the sublimation can be at a pressure between about 0.01 and about 100 torr, and preferably is at a pressure between about 0.1 and about 10 torr. The spacing between source and substrate preferably is between about 0.5 and about 5 mm. The temperature of the substrate upon which each of the semiconductor layers is to be crystallized can be varied, depending on which material is being sublimated. Preferably, each of the CdS and CdTe materials is deposited for a time of between about 0.1 sec to about 10 minutes onto a substrate held at a temperature of between about 300° C. and about 650° C. As is customary in sublimation, the source temperature is maintained in each instance between about 10° and about 500° C. higher than the substrate temperature, preferably about 100°–300° C. higher for the CdS deposition and 20°–50° C. higher for the CdTe deposition. Conventional heating techniques for the source and/or the substrate include, e.g., resistance heating, induction heating, and the like.

Within this process of close-space sublimation, higher conversion efficiencies are achieved when the CdTe layer is sublimated in an oxygen-containing atmosphere on a CdS substrate at a temperature of at least about 575° C., the CdS layer also having been sublimated in $O_2$. It has been found, when keeping constant other variables such as deposition time and thickness of the two layers as well as the amount of oxygen present in the atmosphere, that such a substrate temperature provides a substantial further increase in the conversion efficiency compared to a cell wherein the CdTe is sublimated in oxygen at a lower substrate temperature. Although still further increases in efficiency are achieved at still higher temperatures, the rate of increase decreases significantly beyond the 575° C. temperature.

The mechanism by which this occurs is not as yet fully understood. The effect is illustrated in FIG. 1. The CdS substrate in this case was also sublimated in a 0.4 torr oxygen-containing atmosphere, and each data point represents a separate cell wherein the only difference in the preparation of the cell is the temperature of the CdS substrate for the CdTe sublimation. Whereas a substrate temperature of 500° C. produced a conversion efficiency of about 3.9%, a substrate temperature increased to about 550° C. raised the conversion efficiency to about 6.3%, and an increase to 570° C. raised it still further to about 8.4%. A further increase in substrate temperature to about 600° C. produced a slight increase in efficiency to 8.9%.

It is possible that the critical substrate temperature, i.e., the temperature above which further substantial increases in conversion efficiency are not achievable, can be lowered below about 575° C. if other variables of the sublimation process are further optimized.

In at least certain instances, and particularly for CdTe layers deposited at temperatures below the above-noted substrate temperature of about 575° C., further enhancement of the conversion efficiency can be achieved by an optional process step of heating the already formed CdTe layer in an oxygen-containing atmosphere for a suitable length of time. In this case, normal or even pressurized atmospheres of oxygen can be used, a highly preferred example being air at ambient pressure. Partial pressures of oxygen can also be used, as can an alternating non-oxidizing and oxidizing atmosphere of the type described in U.S. Pat. No. 4,035,197, issued on July 12, 1977, the details of which are hereby expressly incorporated herein by reference. The temperature of such post-treatment can be between about 100° C. and about 600° C., for a time of between about 1 second to about 20 minutes. As will be apparent, the higher the temperature that is used, the lower the length of time of exposure that is needed to further enhance the conversion efficiency.

Such post-heating of the CdTe layer can increase the conversion efficiency by 1 or 2% over that achieved by the same cell lacking the post-heating step.

It is believed that the vapor depositing of one or both of the semiconductor materials in an oxygen-containing atmosphere produces enhanced cconversion efficiencies by the incorporation of oxygen atoms into the semiconductor layer formed in the presence of the oxygen. However, the exact amounts of such oxygen incorporation are so minute that they are difficult to detect or assay.

To complete the cell, electrodes are selected to provide low-impedance contact with at least portions of the exterior surfaces of the two contiguous semiconductor layers formed as described. As used herein, "low impedance" means an impedance that is no greater than that which gives a contact resistance of 50 ohm-cm$^2$. Although such low-impedance contacts at least approach a true ohmic contact, some rectification in the contact can also be tolerated, as is well known.

Each of the electrodes is also in operative contact with its respective layer; that is, in the cell is contacts only its layer, and at least one of the electrodes transmits sufficient activating radiation as to photogenerate an electric potential in the cell. Conveniently, such transmission of radiation is accomplished by rendering one of the electrodes, sometimes called the "window" electrode, transparent or semitransparent to radiation having wavelengths bebetween about 350 and about 900 nm. A useful material having this property is "Nesatron" ® brand glass, a semitransparent electrode material comprising a conductive $In_2O_3(Sn)$ layer coated onto a transparent glass, available from PPG Industries, Inc. Such an electrode typically has a sheet resistance of about 10 to about 50 ohm/square and an optical transmittance of about 80% for visible light. The "Nesatron" ® electrode provides a low-impedance contact with the n-type cadmium sulfide, and as such comprises a highly useful substrate for the first semiconductive layer formation. Other conventional electrode materials also can be selected, providing they have sufficient conductivity, light transmittance, and the appropriate work function that insures the low-impedance contact with n-type CdS. Examples include transparent layers of CdO, $SnO_2$, $Cd_2SnO_4$, and the like on glass, with or without dopants.

Conventionally, the "Nesatron" ® electrodes are cleaned prior to layer formation of the semiconductor material. This can be accomplished by hand-rubbing the surface of the conductive coating with cleansers such as a sulfonate detergent available under the trademark "Alconox" from Alconox, Inc., followed by rinsing with water.

Electrode materials for low-impedance contact with the p-type CdTe are also conventional, and include, for example, gold, silver, copper, nickel, tin, platinum, palladium, chromium, iridium, rhodium, and non-metallic materials such as $Cu_2S$ and $Cu_2Te$ having high electrical conductance and a work function approximately matching that of p-CdTe. These materials may be used singly or in any combination, either in one layer or in successive layers.

Figure 2:
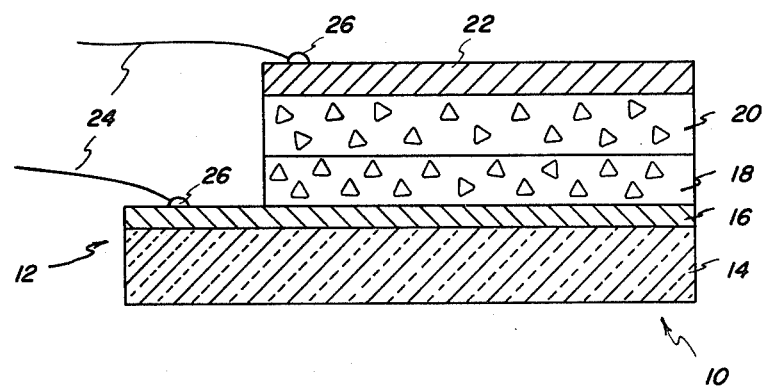
FIG. 2 is a partially schematic section view of a cell prepared in accordance with the invention.

FIG. 2 illustrates a typical photovoltaic cell 10 produced in accordance with the invention. Transparent electrode 12 comprises a support layer 14 of glass bearing a conductive layer 16 of $In_2O_3(Sn)$ such as a "Nesatron" ® electrode, on which is formed layer 18 of n-type CdS. A contiguous layer 20 of p-type CdTe is formed on layer 18, and an electrode layer 22 contacts at least a portion of layer 20. Leads 24 attached as by solder 26 carry away power from the cell. Because layers 18 and 20 are polycrystalline, they can be prepared by a thin-film preparation process to be extremely thin, for example, no greater than about 50 microns thick and preferably from about 0.05 to about 5 microns thick. The total thickness then of the combined semiconductor materials is generally less than about 100 microns, and preferably no greater than about 10 microns. The triangles are indicative of the fact that the layer is polycrystalline.

Electrode layers 16 and 22 are extremely thin conventionally, from about 1000 to about 10,000 Å, and from about 30 to about 1000 Å respectively. Glass support layer 14 is of course comparatively thick, typically about 1000 microns.

Photovoltaic cells of this invention can be used to photogenerate electric power when exposed to activating radiation, preferably through the window electrode. The potential created across the junction can be used as a voltage source, or the current generated by the cell can be drawn off. Thus, among other things, the cell can be used as a voltage generator or as an exposure meter operating from the cell's short circuit current. Such uses are in accordance with conventional practices following well-known procedures.

The following examples further illustrate the invention. Except where noted, pure oxygen atmospheres at stated partial pressures were used. In each example simulated sunlight illumination of 75 mW/cm$^2$ (AM2) was achieved by using a Kodak Carousel projector, Model 600, containing a 500 W tungsten-lamp, with the heat-absorbing glass removed, and a spectrum-correcting-filter set. Conversion efficiencies were calculated from the measured $I_{sc}$, $V_{oc}$, fill factor and the known input illumination. As used herein, "fill factor" means the fraction of the product of $I_{sc}$ and $V_{oc}$ that is available as power output for the cell.

EXAMPLE 1

A cell was prepared of the type shown in FIG. 2, as follows:

On a Nesatron ® glass substrate a CdS layer was deposited at a temperature of about 550° C., in an oxygen-containing atmosphere of about 0.4 torr $O_2$ to a thickness of about 0.2 micron. A CdTe layer about 2 microns thick was then deposited on the CdS layer heated at a temperature of about 590° C., in an atmosphere containing 1.5 torr $O_2$ and 1.5 torr Ar. A 500 Å thick gold electrode layer 6 was vacuum-deposited on the CdTe layer. Under simulated sunlight illumination of 75 mW/Cm$^2$, the cell had a $V_{oc}$ of about 0.7 volts, an $I_{sc}$ of about 16 mA/cm$^2$, and a fill factor of about 0.6. The conversion efficiency was about 8.9%.

Example 2: Enhancement Due to CdS Deposition in $O_2$

To demonstrate the effect of the use of an oxygen-containing atmosphere only during the CdS deposition, a control cell and 5 test cells were prepared as follows: Nesatron ® substrates having a nominal resistivity of 25 ohm/square were cleaned by hand-rubbing with Alconox ® detergent and rinsing with hot tap water prior to deposition of the semiconductor layers. The CdS layer was then prepared by close-space sublimation, wherein the source was a hot-pressed disc of phosphor-grade CdS powder obtained from General Electric. The process was carried out with a source temperature of about 750° C. and a substrate temperature of about 535° C. In the case of the control cell, a vacuum was used containing a partial pressure of $O_2$ of less than 0.01 torr, which was achieved with a mechanical vacuum pump. The five test cells, on the other hand, incorporated 2.5 torr oxygen in the atmosphere during the CdS sublimation. The deposition time was about 2 to 4 minutes, leading to a layer thickness of between about 1 micron and 2 microns. After cooling the substrate to near room temperature, it was placed on another holder for the CdTe deposition. The source was a polycrystalline disc sliced from an ingot which had been prepared by reacting 99.9999% pure Cd and Te in a melt doped with 10 ppm of Au. A source temperature of about 550° C., a substrate temperature of about 450° C. and a deposition time of about 2 minutes were used to achieve a film thickness of about 0.5 microns. The deposition of all CdTe layers was carried out under a partial pressure of $O_2$ of less than about 0.01 torr, provided by a mechanical vacuum pump. The CdTe/CdS structure was post-heated in air at 325° C. for 3 minutes, after which the cell was completed by vapor-depositing a 500 Å thick layer of Au on the CdTe layer.

The photovoltaic response of the control cell lacking the oxygen atmosphere for the CdS deposition was, $V_{oc}=0.37$, $I_{sc}=7.1$ mA/cm$^2$, fill factor approximately equal to about 0.4 and conversion efficiency = 1.38%. In contrast, the average photovoltaic response of the 5 test cells was $V_{oc}=0.48\pm0.03$ mV, $I_{sc}=9.1\pm1.6$ mA/cm$^2$, fill factor of approximately 0.4, and conversion efficiency = $2.5\pm0.3$%, an improvement in conversion efficiency of more than 1%.

Examples 3 and 3A:

To further illustrate the effect of the presence of oxygen during CdS deposition, two different cells were made with the CdS layer prepared under two different pressures of air. Preparation of a "Nesatron" electrode was generally as described in Example 2. One of the cells, Example 3, was prepared by close-space sublimating the CdS layer in a vacuum prepared by evacuating the air using a rotary mechanical pump, to a pressure of less than 0.01 torr, flushing with argon several times, and reducing the argon atmosphere to less than 0.01 torr. The CdTe layer was formed by close-space sublimation for 2 min. on the CdS substrate maintained at 610° C., in an atmosphere of 1.5 torr $O_2$ and 1.5 torr Ar, from a source held at 630° C. Example 3A was prepared identically as Example 3, except that air was used as the atmosphere for the close-space sublimation of the CdS, at a pressure of 0.15 torr. Table 1 illustrates the results.

Table 1

| Example | Ambient Air Pressure, Torr | η, % | $V_{oc}$, mV | $I_{sc}$, mA/cm$^2$ | FF |
|---|---|---|---|---|---|
| 3 | essentially zero | 4.0 | 390 | 15.1 | 0.51 |
| 3A | 0.15 | 8.3 | 650 | 17.0 | 0.56 |

Very little improvement in conversion efficiency was noted upon increasing the air pressure above 0.15 torr. This example demonstrated that although the presence of oxygen in the atmosphere for the deposition of the CdTe produced a significant conversion efficiency, an even higher value is achieved if oxygen is present for the deposition of the CdS also.

Example 4: Enhancement Due to CdTe Deposition in $O_2$

To demonstrate the enhancement achievable by depositing the CdTe layer in an oxygen-containing atmosphere, eight cells were prepared by the procedure of Example 2 on CdS prepared in an atmosphere containing 2.5 torr of oxygen, except that the CdTe layer was deposited using an atmosphere containing 5.0 torr of oxygen. These eight cells showed an average $V_{oc}$ of $0.618\pm0.012$ volts, an average $I_{sc}$ of $11.5\pm1.5$ mA/cm$^2$, a fill factor of approximately $0.5\pm0.01$, and an average conversion efficiency of $4.89\pm0.54$%. Thus, an improvement of more than 2% in conversion efficiency was achieved by depositing the CdTe in an oxygen-containing atmosphere.

Examples 5–11

To demonstrate the effect of the substrate temperature for CdTe deposition, seven cells were made under the following conditions: a CdS layer was deposited by close-space sublimation on a Nesatron ® glass substrate with a nominal electrical resistance of 10 ohm/square. The source temperature was 720° C., the substrate temperature was 550° C., the deposition time was 5 seconds, and the process was carried out in an 0.4 torr oxygen atmosphere. Then a CdTe layer was deposited, again by the close-space sublimation process. The source temperature was 630° C. or 640° C., the substrate temperature varied as shown in Table II, the deposition time was 2 minutes, and the process was carried out in an atmosphere consisting essentially of 1.5 torr $O_2$ and 1.5 L torr Ar. Cell preparation was completed by evaporation of a 500 Å Au layer, using the technique of conventional vacuum evaporation under a pressure of $10^{-6}$ torr. (For the cells with 600° C. or higher substrate temperature, a slightly higher source temperature was used to provide a CdTe layer thickness similar to that of the other cells.) The results are summarized in Table II, and represent the data points in FIG. 1.

Table II

| | CdTe Deposition | | | | | |
| Ex. | Source Temp., °C. | Substrate Temp., °C. | η, % | $V_{oc}$, mV | $I_{sc}$, mA/cm$^2$ | FF |
|---|---|---|---|---|---|---|
| 5 | 630 | 500 | 3.9 | 560 | 12.5 | 0.42 |
| 6 | 630 | 530 | 4.7 | 610 | 13.7 | 0.43 |
| 7 | 630 | 550 | 6.3 | 630 | 14.7 | 0.50 |
| 8 | 630 | 570 | 8.4 | 680 | 16.7 | 0.55 |
| 9* | 630 | 590 | 8.9 | 705 | 16.3 | 0.58 |
| 10 | 640 | 600 | 8.9 | 695 | 16.7 | 0.58 |

Table II-continued

| | CdTe Deposition | | | | | |
|---|---|---|---|---|---|---|
| Ex. | Source Temp., °C. | Substrate Temp., °C. | $\eta$, % | $V_{oc}$, mV | $I_{sc}$, mA/cm$^2$ | FF |
| 11 | 644 | 610 | 8.9 | 710 | 16.5 | 0.58 |

*This is the cell described in Example 1.

Example 12:

To further illustrate the effect of oxygen during CdTe deposition, a series of cells was prepared by varying the oxygen pressure during CdTe deposition while maintaining the other conditions of preparation essentially constant. That is, the deposition of the CdS was either in a 0.4, 0.5 or 1.0 torr oxygen atmosphere, using a $T_{source}$ (source temperature) of 710°, 720° or 725° C. and a $T_{substrate}$ (substrate temperature) of 500° C. or 550° C. The CdTe deposition used a $T_{source}$ of 630° or 640° C. and a $T_{substrate}$ of 600° or 610° C. None of these minor variations are believed to be significant or capable of producing significantly different conversion efficiencies.

It was found that an oxygen pressure of 0.5 torr produced a cell with a conversion efficiency of about 4.6%, whereas at an oxygen pressure of about 1.0 torr or higher, the conversion efficiency was generally constant at about 8.75%±1.25.

The invention has been described in detail with particular reference to certain preferred embodiments thereof, but it will be understood that variations and modifications can be effected within the spirit and scope of the invention.

What is claimed is:

1. In a photovoltaic cell comprising
    first and second contiguous crystalline layers containing, respectively, p-type cadmium telluride and n-type cadmium sulfide, and electrodes in operative, low-impedance contact with at least part of said layers,
    the improvement wherein both said cadmium telluride and said cadmium sulfide are polycrystalline, and together said layers contain oxygen atoms in an amount that is effective to produce a cell having a conversion efficiency that is enhanced over the conversion efficiency of a cell that is produced without said oxygen atoms present.

2. A cell as defined in claim 1, wherein said oxygen-containing layer is the cadmium telluride layer.

3. A cell as defined in claim 1, wherein said oxygen-containing layer is the cadmium sulfide layer.

4. A cell as defined in claim 1, wherein both of said layers contain oxygen atoms in said amount.

5. In a photovoltaic cell comprising
    first and second contiguous crystalline layers containing, respectively, p-type cadmium telluride and n-type cadmium sulfide, and electrodes in operative, low-impedance contact with at least part of said layers,
    the improvement wherein said layers are polycrystalline and the total combined thickness of said layers does not exceed about 10 microns, at least one of said layers containing oxygen atoms in an amount that is effective to produce a cell having a conversion efficiency that is enhanced over the conversion efficiency of a cell that is produced without the oxygen atoms in said layer.

6. A cell as defined in claim 5, wherein said oxygen-containing layer is the cadmium telluride layer.

7. A cell as defined in claim 5, wherein said oxygen-containing layer is the cadmium sulfide layer.

8. A cell as defined in claim 5, wherein both of said layers contain oxygen atoms in said amount.

9. A cell as defined in claim 5, wherein one of said electrodes is a layer of conductive oxide in low-impedance contact with at least part of said CdS layer, said oxide layer being transparent or semitransparent to incident radiation.

10. A cell as defined in claim 9, wherein said oxide is indium tin oxide.

11. A cell as defined in claim 9, wherein the other of said electrodes is a layer of metal in low-impedance contact with at least part of said CdTe layer.

12. A cell as defined in claim 11, wherein said metal is gold.

13. A cell for converting incident radiation into electricity, comprising
    first and second contiguous polycrystalline layers containing, respectively, p-type cadmium telluride and n-type cadmium sulfide, and electrodes in operative, low-impedance contact with at least part of said layers, at least one of said electrodes being transparent or semi-transparent to said incident radiation,
    said cell being further characterized by a conversion efficiency of at least about 6.0% when exposed to AM2 light.

14. A cell for converting incident radiation into electricity, comprising
    first and second contiguous polycrystalline layers containing, respectively, p-type cadmium telluride and n-type cadmium sulfide, and electrodes in operative, low-impedance contact with at least part of said layers, at least one of said electrodes being transparent or semitransparent to said incident radiation,
    said cell being further characterized by a combined thickness of said layers that is no greater than about 10 microns and a conversion efficiency of at least about 6% when exposed to AM2 light.

15. In a photovoltaic cell comprising
    first and second contiguous crystalline layers containing, respectively, n-type cadmium sulfide and p-type cadmium telluride, and electrodes in operative, low-impedance contact with at least part of said layers,
    the improvement wherein both said cadmium telluride and said cadmium sulfide are polycrystalline, at least one of said layers having been formed in an oxygen-containing atmosphere for a time and at a temperature, and in an amount of oxygen, sufficient to provide a conversion efficiency that is enhanced over the conversion efficiency of a cell produced identically but without said at least one layer having been formed in said oxygen-containing atmosphere.

16. In a photovoltaic cell comprising
    first and second contiguous polycrystalline layers containing, respectively, n-type cadmium sulfide and p-type cadmium telluride, and electrodes in operative, low-impedance contact with at least part of said layers,
    the improvement wherein the combined thickness of said layers does not exceed about 10 microns, at least one of said layers having been formed in an oxygen-containing atmosphere for a time and at a temperature, and in an amount of oxygen, sufficient to provide a conversion efficiency that is enhanced over the conversion efficiency of a cell produced identically but without said at least one layer having been formed in said oxygen-containing atmosphere.

17. A cell as defined in claim 16, wherein said layer formed in an oxygen-containing atmosphere is the cadmium telluride layer.

18. A cell as defined in claim 17, wherein said oxygen-containing atmosphere was at a pressure of at least about 1 torr of oxygen.

19. A cell as defined in claim 16, wherein said layer formed in an oxygen-containing atmosphere is the cadmium sulfide layer.

20. A cell as defined in claim 16, wherein both of said layers were formed in an oxygen-containing atmosphere.

21. In a process for manufacturing a photovoltaic cell by depositing, in the vapor phase, contiguous polycrystalline layers of n-type cadmium sulfide and p-type cadmium telluride and securing an electrode to at least a portion of each of said layers,
the improvement comprising depositing at least one of said layers in an oxygen-containing atmosphere for a time and at a temperature, and in an amount of oxygen, which are sufficient to provide a conversion efficiency that is enhanced over the efficiency of a cell produced without said oxygen atmosphere.

22. A process as defined in claim 21, wherein both of said layers are deposited by close-space sublimation in an oxygen-containing atmosphere and the temperature of the substrate during the depositing of CdTe is at least about 575° C., the amount of time of said depositing of said layers being sufficient to provide a conversion efficiency that is enhanced over the conversion efficiency of a cell produced identically but at a CdTe substrate temperature less than about 575° C.

23. A process as defined in claim 21 and further including the step of heating in an oxygen-containing atmosphere either or both of said layers after their deposition, for a time and at a temperature, and in an amount of oxygen, which are sufficient to provide a conversion efficiency that is enhanced over the efficiency of a cell produced without said post-deposition heating.

24. A process as defined in claim 21, wherein the deposition of said CdTe is in an atmosphere containing at least about 1 torr oxygen.

25. A process of converting incident radiation into electrical power, comprising the steps of
(a) exposing to said radiation, a photovoltaic cell comprising
first and second contiguous polycrystalline layers containing, respectively, n-type cadmium sulfide and p-type cadmium telluride, said layers together containing oxygen atoms in an amount that is effective to produce a cell having a conversion efficiency that is enhanced over the conversion efficiency of a cell that is produced without said oxygen atoms, and electrodes in operative, low-impedance contact with at least part of said layers, at least one of said electrodes being transparent or semitransparent to said incident radiation; and
(b) drawing off power from said cell in proportion to said enhanced conversion efficiency.

26. A process of converting incident radiation into electrical power, comprising the steps of
(a) exposing to said radiation, a photovoltaic cell comprising
first and second contiguous polycrystalline layers containing, respectively, n-type cadmium sulfide and p-type cadmium telluride, at least one of said layers being formed in an oxygen-containing atmosphere for a time and at a temperature, and in an amount of oxygen, which are sufficient to provide a conversion efficiency that is enhanced over the conversion efficiency of a cell produced identically but without being formed in said oxygen-containing atmosphere; and electrodes in operative, low-impedance contact with at least part of said layers, at least one of said electrodes being transparent of semitransparent to said incident radiation; the total combined thickness of said layers not exceeding about 10 microns; and
(b) drawing off power from said cell in proportion to said enhanced conversion efficiency.

27. In a photovoltaic cell comprising
first and second contiguous crystalline layers containing, respectively, p-type cadmium telluride and n-type cadmium sulfide, and electrodes in operative, low-impedance contact with at least part of said layers,
the improvement wherein both said cadmium telluride and said cadium sulfide are polycrystalline, and together said layers contain oxygen atoms in an amount that is effective to produce a cell having a conversion efficiency that is enhanced over the conversion efficiency of a cell generally identical in structure but containing only the amount of oxygen atoms in said layers that is present when the layers are formed in an atmosphere that has an oxygen partial pressure of less than 0.01 Torr.

28. A cell as defined in claim 27, wherein one of said electrodes is a layer of conductive oxide in low-impedance contact with at least part of said CdS layer, said oxide layer being transparent or semi-transparent to incident radiation.

29. A cell as defined in claim 28, wherein said oxide is indium tin oxide.

30. A cell as defined in claim 28, wherein the other of said electrodes is a layer of metal in low-impedance contact with at least part of said CdTe layer.

31. A cell as defined in claim 30, wherein said metal is gold.

* * * * *

UNITED STATES PATENT AND TRADEMARK OFFICE
CERTIFICATE OF CORRECTION

PATENT NO. : 4,207,119
DATED : June 10, 1980
INVENTOR(S) : Y. S. Tyan

It is certified that error appears in the above-identified patent and that said Letters Patent are hereby corrected as shown below:

Col. 2, line 59, "oxgen", should read --oxygen--.

Col. 5, line 22, "cconversion", should read --conversion--; line 38, "cell is", should read --cell it--; line 45, "bebetween", should read --between--.

Col. 8, line 50, delete "L".

Col. 12, line 25, "transparent of", should read --transparent or--.

Signed and Sealed this

Sixth Day of January 1981

[SEAL]

Attest:

SIDNEY A. DIAMOND

Attesting Officer

Commissioner of Patents and Trademarks